United States Patent
Dannenberg et al.

(10) Patent No.: US 11,059,717 B2
(45) Date of Patent: Jul. 13, 2021

(54) MICROMECHANICAL PRESSURE SENSOR AND METHOD FOR PRODUCING SAID MICROMECHANICAL PRESSURE SENSOR

(71) Applicant: Robert Bosch GmbH, Stuttgart (DE)

(72) Inventors: Arne Dannenberg, Metzingen (DE); Tobias Henn, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/492,220

(22) PCT Filed: Mar. 23, 2018

(86) PCT No.: PCT/EP2018/057433
§ 371 (c)(1),
(2) Date: Sep. 9, 2019

(87) PCT Pub. No.: WO2018/177922
PCT Pub. Date: Oct. 4, 2018

(65) Prior Publication Data
US 2020/0010317 A1     Jan. 9, 2020

(30) Foreign Application Priority Data
Mar. 28, 2017   (DE) ..................... 10 2017 205 244.9

(51) Int. Cl.
*B81C 1/00*     (2006.01)
*B29C 45/14*    (2006.01)

(52) U.S. Cl.
CPC .... *B81C 1/00325* (2013.01); *B29C 45/14311* (2013.01); *B81B 2201/0264* (2013.01);
(Continued)

(58) Field of Classification Search
CPC .................................................. B81C 1/00325
See application file for complete search history.

(56) References Cited

U.S. PATENT DOCUMENTS

| 2001/0034083 A1 | 10/2001 | Coyle et al. |
| 2010/0320587 A1 | 12/2010 | Lee et al. |

(Continued)

FOREIGN PATENT DOCUMENTS

| CN | 201680940 U | 12/2010 |
| CN | 102749167 A | 10/2012 |

(Continued)

OTHER PUBLICATIONS

International Search Report for PCT/EP2018/057433, dated Jun. 7, 2018.

*Primary Examiner* — Moazzam Hossain
*Assistant Examiner* — Mohammad A Rahman
(74) *Attorney, Agent, or Firm* — Norton Rose Fulbright US LLP; Gerard Messina

(57) ABSTRACT

A micromechanical pressure sensor, having a sensor core formed in a silicon substrate in a pressure-sensitive region, having a sensor membrane, a first cavity being formed in the silicon substrate on the sensor membrane; a second cavity formed between a rear-side surface of the silicon substrate and the sensor core, access holes that go out from the rear-side surface of the silicon substrate being connected to the second cavity; and at least one anchoring recess going out from the rear-side surface being formed in an anchoring region of the silicon substrate surrounding the pressure-sensitive region, the anchoring recess being formed such that a molding compound can flow into the anchoring recess.

10 Claims, 5 Drawing Sheets

(52) U.S. Cl.
CPC ... *B81B 2203/033* (2013.01); *B81B 2207/012* (2013.01); *B81C 2203/0154* (2013.01)

(56) References Cited

U.S. PATENT DOCUMENTS

| | | |
|---|---|---|
| 2014/0286509 A1 | 9/2014 | Sciutti et al. |
| 2014/0299949 A1* | 10/2014 | Conti ................... H04R 19/005 |
| | | 257/416 |
| 2016/0023890 A1 | 1/2016 | Reinmuth |
| 2016/0122181 A1* | 5/2016 | Picco .................... G01L 9/0054 |
| | | 257/419 |
| 2019/0165250 A1* | 5/2019 | Sounart ............... H01L 41/1132 |

FOREIGN PATENT DOCUMENTS

| | | |
|---|---|---|
| CN | 104422553 A | 3/2015 |
| CN | 104471364 A | 3/2015 |
| DE | 10 2004 006 197 A1 | 1/2005 |
| DE | 102015116353 A1 | 5/2016 |
| DE | 102016102152 A1 | 9/2016 |
| EP | 2252077 A1 | 11/2010 |

\* cited by examiner

MICROMECHANICAL PRESSURE SENSOR AND METHOD FOR PRODUCING SAID MICROMECHANICAL PRESSURE SENSOR

FIELD

The present invention relates to a micromechanical pressure sensor and to a method for producing the micromechanical pressure sensor.

BACKGROUND INFORMATION

Micromechanical pressure sensors, in which a pressure difference is measured as a function of a deformation of a sensor membrane, are described, for example, in German Patent Application No. DE 10 2004 006 197 A1.

Recently, for the sensor cores of such pressure sensors a stress decoupling takes place in the MEMS that decouples the MEMS from stress of the package and of the PCB. If a suitable process management is selected here, with only small access holes on a substrate rear side, then a whole-surface opening of the substrate rear side is avoided, and capping of the pressure sensor can be omitted.

German Patent Application No. DE 10 2015 116 353 A1 describes a microintegrated encapsulated MEMS having mechanical decoupling, and a method for its production.

In the molding of such a MEMS, the MEMS is molded in together with an ASIC and the substrate in such a way that the molding compound on a side of the MEMS facing away from the ASIC has a mold protrusion that fixes the MEMS on the ASIC.

SUMMARY

The present invention relates to a micromechanical pressure sensor system, as well as a method for producing such a pressure sensor.

Accordingly, the following example embodiments are provided:

a micromechanical pressure sensor, having a sensor core formed in a silicon substrate in a pressure-sensitive region, having a sensor membrane, a first cavity being formed in the silicon substrate on the sensor membrane; a second cavity formed between a rear-side surface of the silicon substrate and the sensor core, access holes, going out from the rear-side surface of the silicon substrate, being connected to the second cavity; and at least one anchoring recess, going out from the rear-side surface, being formed in an anchoring region of the silicon substrate surrounding the pressure-sensitive region, the anchoring recess being formed such that a molding compound can flow into the anchoring recess;

a micromechanical pressure sensor system, including the micromechanical pressure sensor described above; an ASIC, the ASIC being bonded, in the anchoring region, to a front-side surface of the micromechanical pressure sensor situated opposite the rear-side surface; a package substrate and mold, the micromechanical pressure sensor and the ASIC being molded in together, and the molding compound being meshed with the micromechanical pressure sensor via the anchoring recess;

a method for producing a micromechanical pressure sensor, having the steps: providing a MEMS wafer having a silicon substrate and having a sensor core formed in the silicon substrate in a pressure-sensitive region of the MEMS wafer, having a sensor membrane, a first cavity being formed on the sensor membrane; provision of an additional wafer; bonding of the MEMS wafer to the additional wafer at a front-side surface of the MEMS wafer, in an anchoring region of the MEMS wafer surrounding the pressure-sensitive region; etching of the MEMS wafer from a rear-side surface of the MEMS wafer situated opposite the front-side surface, a second cavity that exposes the sensor core being formed in the pressure-sensitive region during the etching, and at least one anchoring recess being formed in the anchoring region; and molding in the MEMS wafer together with the additional wafer using a mold, the molding compound engaging in the anchoring recess, and the molding compound meshing with the MEMS wafer in this way.

According to the present invention, in stress-decoupled micromechanical pressure sensor systems having a mold protrusion on a rear-side surface of a micromechanical pressure sensor of the micromechanical pressure sensor system, a delamination of the mold protrusion can occur, which can cause failures in the micromechanical pressure sensor systems.

The underlying idea of the present invention is to take this finding into account and to realize a micromechanical pressure sensor system in such a way that the mold protrusion adheres better to the micromechanical pressure sensor, thus preventing a delamination. For this purpose, on a rear-side surface of the micromechanical pressure sensor anchoring recesses are provided that increase the adhesion of the molding compound on the rear-side surface. The formation of the anchoring recesses does not result in additional costs, because the formation of the anchoring recesses takes place in the same step as the formation of access holes for stress decoupling of the micromechanical pressure sensors.

Advantageous specific embodiments and developments result from the description herein, with reference to the Figures.

A specific embodiment includes at least two anchoring recesses. The formation of a multiplicity of anchoring recesses improves a meshing of the mold with the rear-side surface, and in addition a large number of anchoring recesses prevents the mold from flowing into the access holes.

In a further specific embodiment, adjacent anchoring recesses within the silicon substrate are connected to one another. A connection of the anchoring recesses within the silicon substrate increases an adhesion between the micromechanical pressure sensor and the mold.

In a further specific embodiment, adjacent anchoring recesses within the silicon substrate are not connected to one another, thus increasing a mechanical stability of the micromechanical pressure sensor.

In a further specific embodiment, the anchoring recess extends from the rear-side surface deeper into the silicon substrate than does the second cavity, so that as a result more molding compound can flow into the anchoring recesses, which in turn increases the adhesion between the micromechanical pressure sensor and the molding compound.

In a further specific embodiment, the anchoring recesses extend, in their depth, only into a region between the rear-side surface and the second cavity. For example, they form depressions on the rear-side surface. These superficially formed depressions roughen the rear-side surface, and in this way increase an adhesion between the micromechanical pressure sensor and the molding compound, in comparison with a smooth rear-side surface, and thus prevent the mold from peeling off from the rear-side surface.

In a further specific embodiment, the anchoring recess is formed as a collecting trench running around the pressure-sensitive region, preventing a flowing of the mold into the pressure-sensitive region and thus into the access holes.

In a further specific embodiment, a micromechanical pressure sensor system is formed having a collecting trench running around the pressure-sensitive region, and a film covering is provided on the rear-side surface. The film covering and the collecting trench prevent the molding compound from flowing into the access holes, and in addition the film covering mechanically protects the rear-side surface.

In a further specific embodiment, the molding compound is an injection molding that is provided on the rear-side surface at least in parts in the anchoring region, and is not present at least in parts in the pressure-sensitive region. This specific embodiment achieves an improved sensitivity.

In a further specific embodiment, the anchoring recess extends into the ASIC, which further increases the adhesion of the molding compound on the micromechanical sensor.

In a further specific embodiment, the molding in includes an application of a film covering on the rear-side surface of the MEMS wafer. Due to the use of a film covering is used, it is no longer necessary to provide an individual stamp during the molding for each sensor unit. In addition, a film molding requires a lower press-on pressure, thus preventing a risk of breaking a grid formed by the access holes.

BRIEF DESCRIPTION OF THE DRAWINGS

Below, the present invention is explained in more detail on the basis of the exemplary embodiments shown in the schematic Figures.

Figure 1:
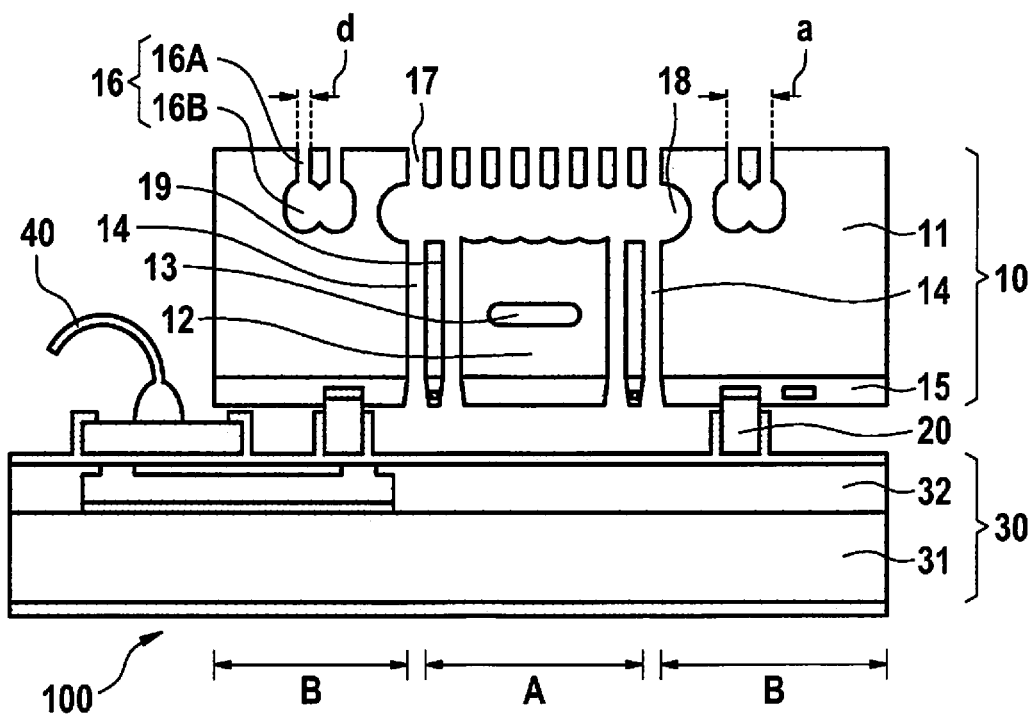
FIG. 1 shows a schematic representation of a micromechanical pressure sensor according to a first specific embodiment of the present invention.

In all the Figures, identical or functionally identical elements and devices are provided with the same reference characters, unless otherwise indicated. The numbering of method steps is provided for clarity, and in particular is not intended to imply a particular temporal sequence, unless otherwise indicated. In particular, a plurality of method steps may be carried out simultaneously.

DETAILED DESCRIPTION OF EXAMPLE EMBODIMENTS

FIG. 1 shows a cross-sectional view of a micromechanical pressure sensor 10 that is bonded to a metallization 15 on an additional wafer 30 via bonding regions 20. Here, additional wafer 30 is an ASIC wafer having an electronic functional layer 32 and a substrate layer 31, but alternatively can also be a passive substrate wafer.

Micromechanical pressure sensor 10 has a silicon substrate 11 in which a sensor core is formed in a pressure-sensitive region A. The sensor core includes a sensor membrane 12 and a first cavity 13 formed on sensor membrane 12. In addition, the micromechanical pressure sensor has, in pressure-sensitive region A, a second cavity 18 formed between a rear-side surface and the sensor core, access holes 17 that go out from the rear-side surface being fluidically connected to sensor membrane 12 via passages 14 that are formed around substrate regions 19.

In addition, micromechanical pressure sensor 10 has an anchoring region B that surrounds the pressure-sensitive region. Anchoring recesses 16 are formed in anchoring region B. Anchoring recesses 16 can for example be made up of an upper, e.g. linear, segment 16A and a lower chamber segment 16B. A diameter d of linear segment 16A of anchoring recesses 16 is selected such that a molding compound 15 can flow into linear segments 16A. Diameter d is for example greater than 8 μm. If diameter d is chosen so that it is greater than a diameter of the access holes 17, then anchoring recesses 16 are trenched deeper than access holes 17, and this results in a better meshing of molding compound 50 with silicon substrate 11. On the other hand, however, diameter d must not be chosen to be too large, because otherwise anchoring recesses 16 would then etch too quickly, and too little process time would then be available for the etching of access holes 17.

A spacing a between anchoring recesses 16 can be chosen such that the chamber segments 16B of adjacent anchoring recesses 16A, formed in an exposure step for the formation of second cavity 18, are connected to one another. In this way, a greater quantity of molding compound 50 can flow into anchoring recesses 16. This increases an adhesion between molding compound 50 and micromechanical pressure sensor 10, while on the other hand a mechanical stability of micromechanical pressure sensor 10 is reduced. In order to match a coefficient of expansion of molding compound 50 to the coefficient of expansion of silicon substrate 11 of micromechanical sensor 10, molding compound 50 can be provided with pellets of silicon oxide as filling compound.

Alternatively, the spacing a between anchoring recesses 16 can also be chosen such that chamber segments 16B are not connected in the exposure step. This increases a mechanical stability of silicon substrate 11 of micromechanical pressure sensor 10.

Figure 2:
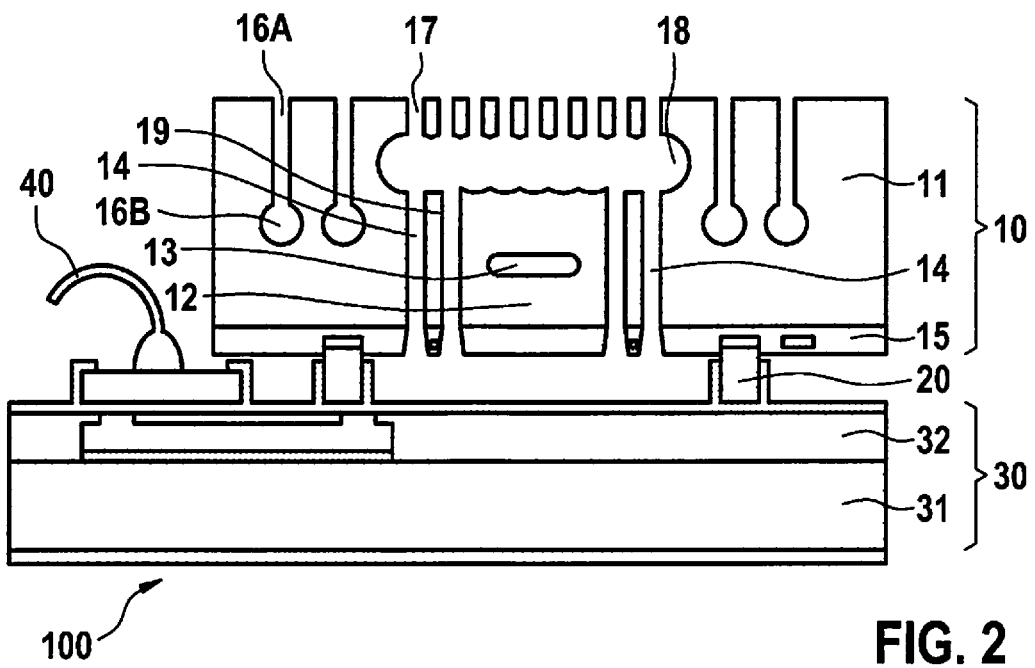
FIG. 2 shows a schematic representation of a micromechanical pressure sensor according to a second specific embodiment of the present invention.

FIG. 2 shows a micromechanical pressure sensor 10 according to a second specific embodiment, in which anchoring recesses 16 extend deeper into silicon substrate 11 than does second cavity 18. In addition, the spacing a between adjacent anchoring recesses 16 is selected such that the chamber segments 16B of adjacent anchoring recesses 16 are not connected to one another.

Figure 3:
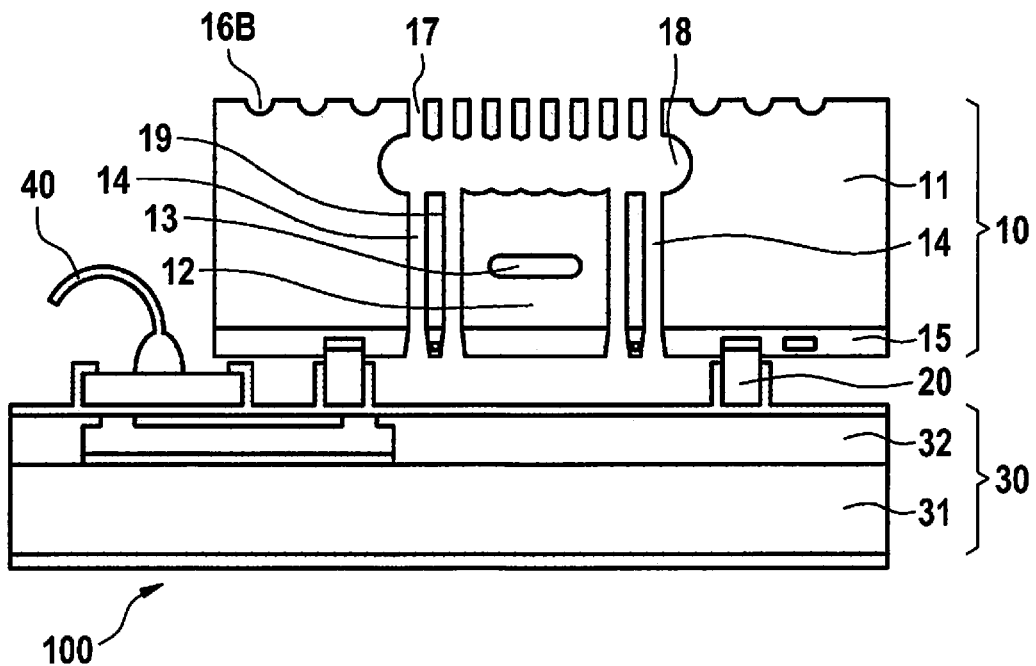
FIG. 3 shows a schematic representation of a micromechanical pressure sensor according to a third specific embodiment of the present invention.

FIG. 3 shows a third specific embodiment of micromechanical pressure sensor 10. Here, a diameter d of upper segments 16A is either chosen to be so small that upper segments 16A extend only very flatly into the silicon substrate and are completely removed when there is a rear-side thinning of silicon substrate 11, or, if a thinning is not carried out, chamber segments 16B are formed so that, in a finished micromechanical pressure sensor according to the third specific embodiment, only chamber segments 16B are formed on the rear-side surface of silicon substrate 11, where they form e.g. hemispherical depressions. The resulting rear-side surface is thus a roughened surface having a multiplicity of superficial depressions. The third specific embodiment, having the roughened surface, permits a better adhesion of mold 50 compared to a smooth rear-side surface. In addition, the third specific embodiment has increased mechanical stability compared to the first and second specific embodiments.

Figure 4:
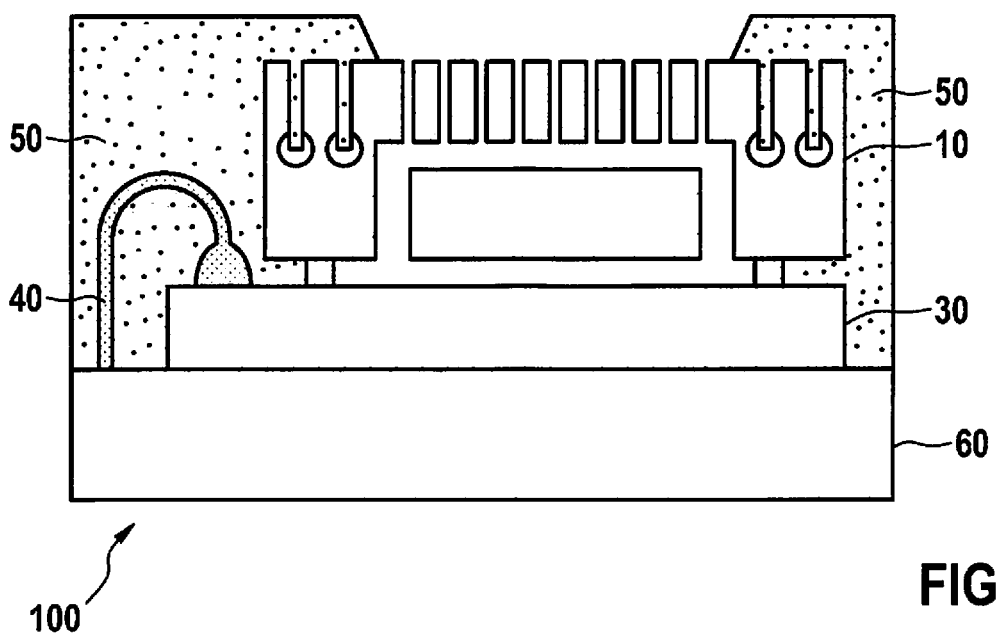
FIG. 4 shows a schematic representation of a micromechanical pressure sensor system according to a fourth specific embodiment of the present invention.

FIG. 4 shows a schematic representation of a micromechanical pressure sensor system 100 according to a fourth specific embodiment of the present invention. In addition to micromechanical pressure sensor 10, the micromechanical pressure sensor system has an ASIC 30 that is situated on a package substrate 60. A wire bonding wire 40 is connected to a contact (not shown) on package substrate 60. Micromechanical pressure sensor 10 can be any of the micromechanical pressure sensors 10 of the previous first through third specific embodiments. Via the anchoring recesses 16, molding compound 50 is meshed with micromechanical pressure sensor 10. The meshing prevents a peeling off of mold 50 on the rear-side surface of micromechanical pressure sensor 10. Alternatively to the specific embodiment in FIG. 4, anchoring recesses 16 can also extend into ASIC 30.

Figure 5:
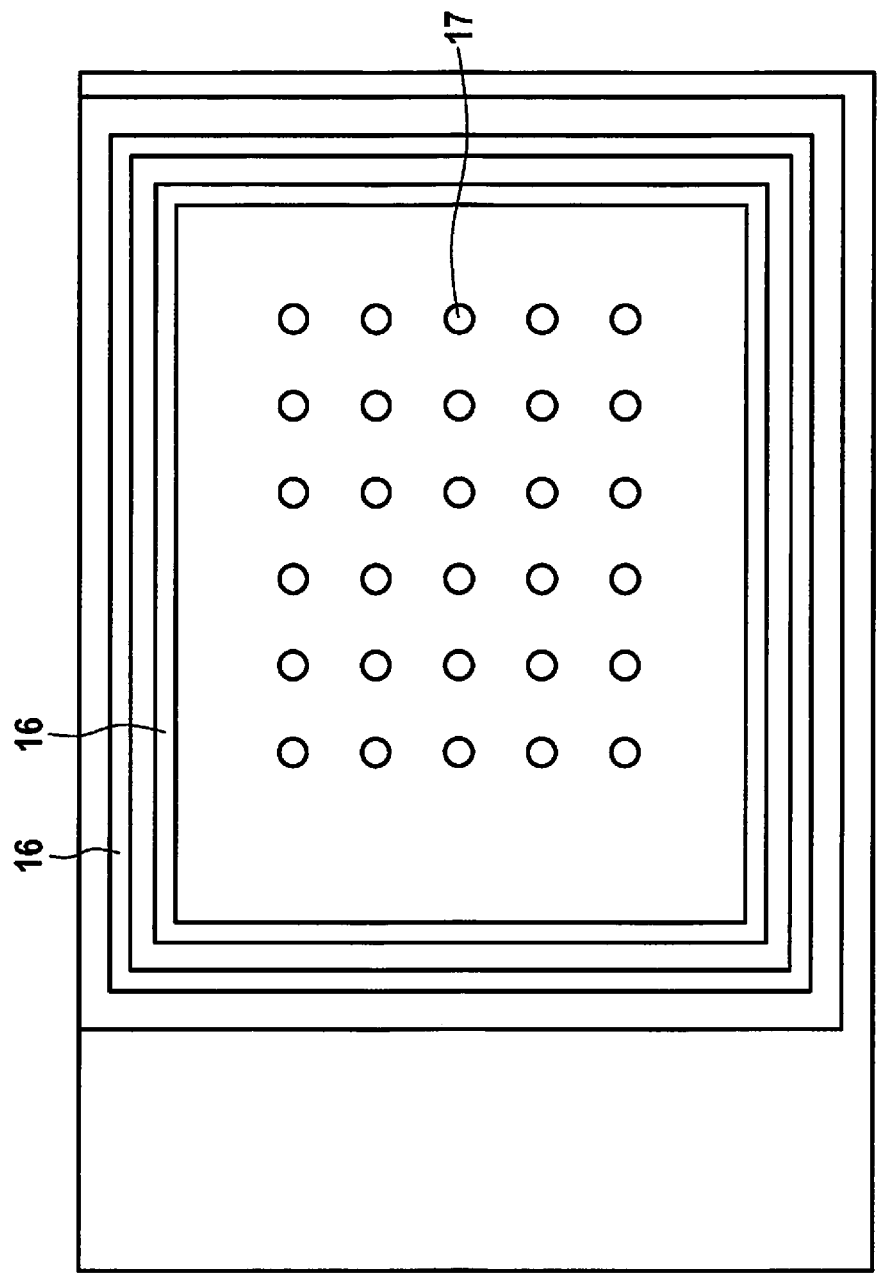
FIG. 5 shows a schematic representation of a top view of a rear-side surface of a micromechanical pressure sensor according to a fifth specific embodiment of the present invention.

FIG. 5 shows a top view of a rear-side surface of a micromechanical pressure sensor 10 according to a fifth specific embodiment. In contrast to the first three specific embodiments, here anchoring recesses 16 are formed not as holes, but rather as circumferential collecting trenches 16. In the depicted specific embodiment, in the direction from inside to outside, two circumferential collecting trenches 16 are formed. However, only one collecting trench 16 may equally well be formed.

Figure 6:
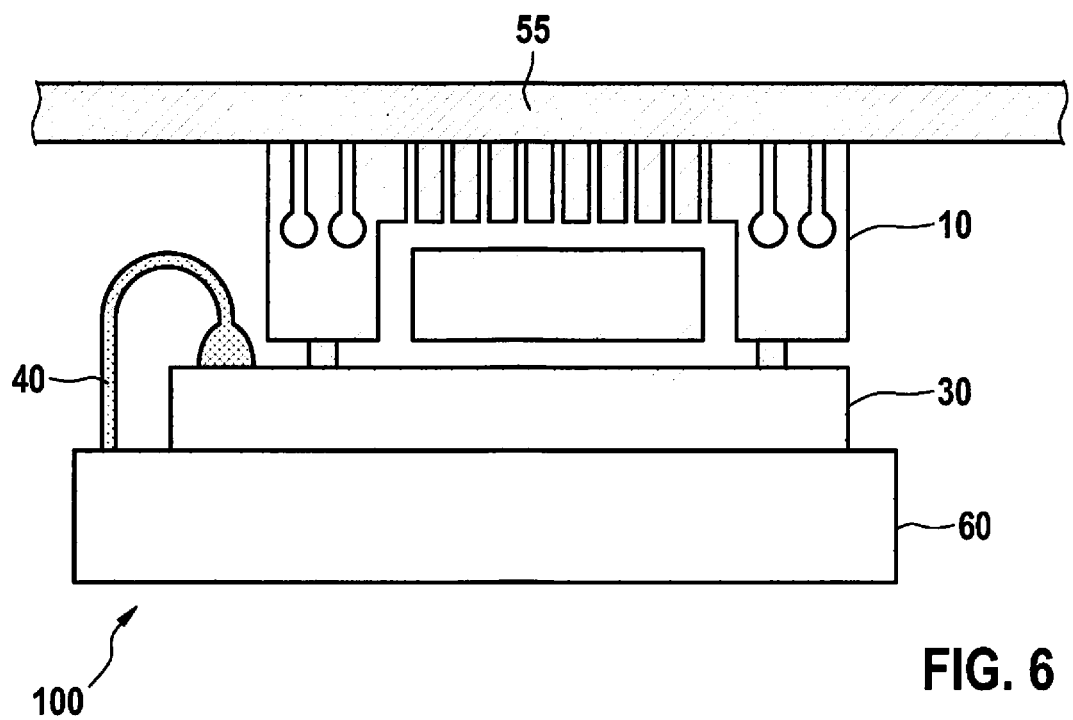
FIG. 6 shows a schematic representation of a micromechanical pressure sensor according to the fifth specific embodiment of the present invention.
Figure 7:
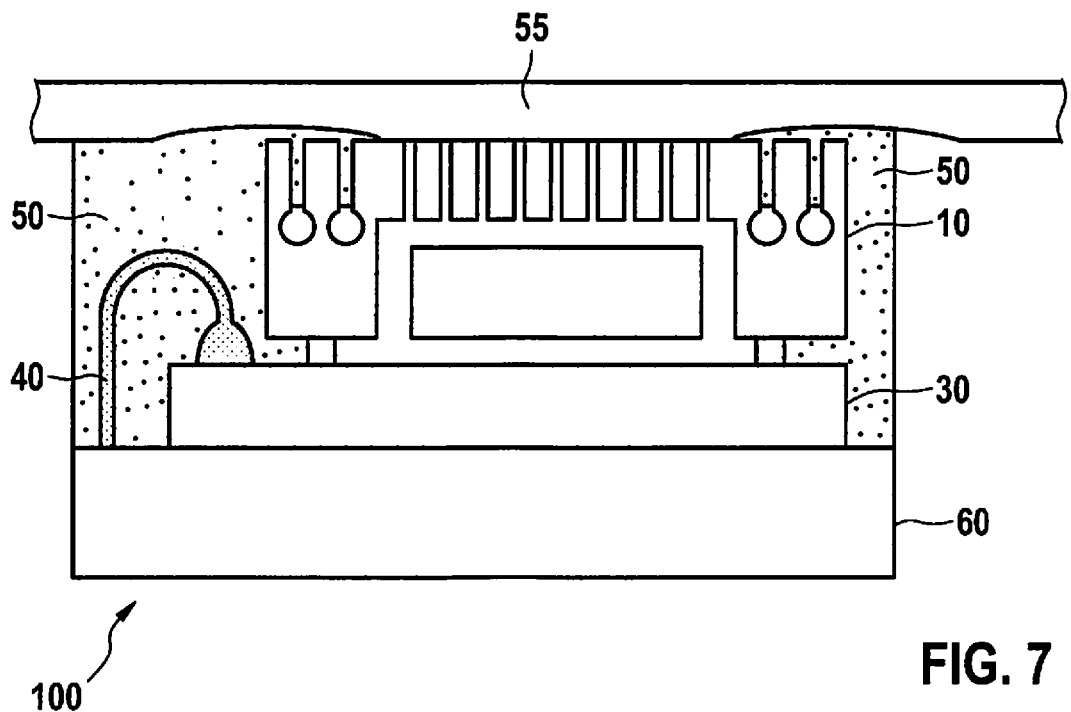
FIG. 7 shows a schematic representation of a micromechanical pressure sensor according to the fifth specific embodiment of the present invention.

FIG. 6 shows a section through a micromechanical pressure sensor system according to a sixth specific embodiment, having a micromechanical pressure sensor 10 according to the fourth specific embodiment. A film covering 55 is pressed onto the rear-side surface of the micromechanical pressure sensor. After film covering 55 has been pressed onto the rear-side surface, micromechanical pressure sensor system 100 is molded in with a molding compound 50. During this, film covering 55 prevents molding compound 50 from wetting the rear-side surface. Locally, during the molding with molding compound 50, film covering 55 may be lifted at the edge of micromechanical pressure sensor 10, and molding compound 50 then flows into anchoring recesses 16 in the anchoring region, which prevent a further flowing of the molding compound e.g. up to the access holes, as shown in FIG. 7. After the molding process, film covering 55 can be removed.

If film covering 55 is a watertight permeable membrane, such as Gore-Tex or DuPont™ Tyvek® Supro, then the film covering can advantageously be left in place after the molding over access holes 17, so that the covering covers the access holes in watertight fashion, but continues to ensure an exchange of air (pressure) through access holes 17 and through second cavern 18 up to sensor membrane 12.

Alternatively to the sixth specific embodiment, a micromechanical pressure sensor 10, as shown in FIG. 4, can also be molded in without using a film covering, using a stamp.

Figure 8:
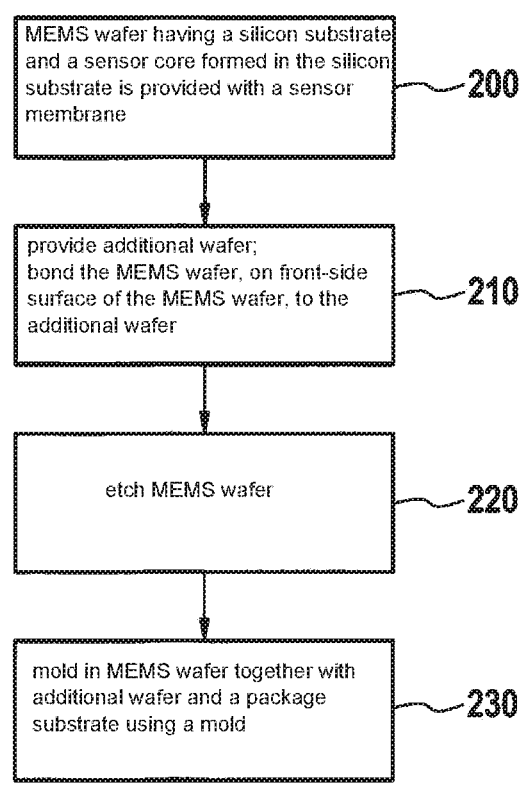
FIG. 8 shows a schematic flow diagram of a method for producing a micromechanical pressure sensor system according to one of the preceding specific embodiments.

FIG. 8 shows a schematic flow diagram of a method for producing a micromechanical pressure sensor system 100 according to one of the preceding specific embodiments. In a step 200, a MEMS wafer having a silicon substrate and having a sensor core formed in the silicon substrate in a pressure-sensitive region of the MEMS wafer is provided with a sensor membrane, a first cavity being formed on the sensor membrane. In a step 210, an additional wafer is provided, the additional wafer being for example an ASIC wafer 30.

In a step 210, the MEMS wafer, on a front-side surface of the MEMS wafer, is bonded to the additional wafer in an anchoring region of the MEMS wafer surrounding the pressure-sensitive region.

In a step 220, the MEMS wafer is etched, from a rear-side surface of MEMS wafer 20 situated opposite the front-side surface, a second cavity being formed during the etching in the pressure-sensitive region that exposes the sensor core, and at least one anchoring recess 16 being formed in the anchoring region. The etching process according to step 220 can be for example a two-stage etching process in which, first, in an anisotropic etching process, the linear upper segments 16A are formed, and subsequently, in an isotropic etching process, the chamber segments 16B are formed. Alternatively, however, a one-stage method can also be used in which trapezoidal recesses are formed that then form second cavity 18 to an adequate depth.

In a step 230, the MEMS wafer is molded in, together with the additional wafer and a package substrate, using a mold, the molding compound engaging in the anchoring recesses, and thus meshing the molding compound with the MEMS wafer. Step 230 can additionally include an application of a film covering 55 on the rear-side surface of the MEMS wafer, the film covering 55 preventing molding compound 50 from flowing into access holes 17 during step 230. Alternatively, step 230 can be carried out using a stamp, and in this case the stamp, applied in the pressure-sensitive region of the MEMS wafer on the rear-side surface, prevents the molding compound from flowing into access holes 17.

Although the present invention has been described above on the basis of preferred exemplary embodiments, it is not limited thereto, but rather can be modified in many ways. In particular, the present invention can be modified in many ways without departing from the core of the present invention.

What is claimed is:

1. A micromechanical pressure sensor system, comprising:
    a micromechanical pressure sensor, which includes:
        a sensor core, formed in a silicon substrate in a pressure-sensitive region, the sensor core including a sensor membrane, a first cavity formed on the sensor membrane in the silicon substrate, a second cavity formed between a rear-side surface of the silicon substrate and the sensor core, access holes that go out from the rear-side surface of the silicon substrate being fluidically connected to the sensor membrane via passages that are formed around the substrate regions; and
        at least two anchoring recesses going out from the rear-side surface, formed in an anchoring region of the silicon substrate surrounding the pressure-sensitive region, wherein the pressure-sensitive region is between the at least two anchoring regions;
    an ASIC bonded in the anchoring region to a front-side surface situated opposite the rear-side surface of the micromechanical pressure sensor; and
    a package substrate and molding compound, the micromechanical pressure sensor and the ASIC being molded in together, and the molding compound being meshed with the micromechanical pressure sensor via the anchoring recesses;
    wherein the anchoring recesses are separate from the access holes, and wherein each of the anchoring recesses is formed as: (i) an anchoring recess having a linear segment and a lower chamber segment (ii) a chamber segment formed on the rear side surface of the silicon substrate, so as to form a hemispherical depression; and (iii) a circumferential collecting trench.

2. The micromechanical pressure sensor system as recited in claim 1, wherein adjacent anchoring recesses within the silicon substrate are connected to one another.

3. The micromechanical pressure sensor system as recited in claim 1, wherein adjacent anchoring recesses within the silicon substrate are not being connected to one another.

4. The micromechanical pressure sensor system as recited in claim 1, wherein the anchoring recess extend from the rear-side surface deeper into the silicon substrate than does the second cavity.

5. The micromechanical pressure sensor system as recited in claim 1, wherein the anchoring recesses extend, in their depth, only into a region between the rear-side surface and the second cavity.

6. The micromechanical pressure sensor system as recited in claim 1, wherein the anchoring recess is formed as a collecting trench running around the pressure-sensitive region.

7. The micromechanical pressure sensor system as recited in claim 6, wherein a film covering covers the rear-side surface at least partially, and the connecting holes are free of the film covering.

8. The micromechanical pressure sensor system as recited in claim 6, wherein a film covering covers the rear-side surface at least partially and covers the connecting holes completely, and the film covering being a watertight permeable membrane.

9. The micromechanical pressure sensor system as recited in claim 1, wherein the molding compound is an injection molding that is provided on the rear-side surface at least partially in the anchoring region and is at least partially absent in the pressure-sensitive region.

10. The micromechanical pressure sensor system as recited in claim 1, wherein the anchoring recess extends into the ASIC.

\* \* \* \* \*